(12) United States Patent
Kong et al.

(10) Patent No.: US 8,587,118 B2
(45) Date of Patent: Nov. 19, 2013

(54) LIGHT EMITTING DEVICE PACKAGE AND MANUFACTURING METHOD THEREOF

(75) Inventors: Sung Min Kong, Gwangju (KR); Myung Gi Kim, Gwangju (KR); Hyeong Seok Im, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 195 days.

(21) Appl. No.: 12/595,768

(22) PCT Filed: Jun. 19, 2008

(86) PCT No.: PCT/KR2008/003480
§ 371 (c)(1),
(2), (4) Date: Oct. 13, 2009

(87) PCT Pub. No.: WO2008/156317
PCT Pub. Date: Dec. 24, 2008

(65) Prior Publication Data
US 2010/0171144 A1    Jul. 8, 2010

(30) Foreign Application Priority Data

Jun. 20, 2007   (KR) .................. 10-2007-0060305

(51) Int. Cl.
*H01L 23/48*   (2006.01)
(52) U.S. Cl.
USPC ...... 257/735; 257/99; 257/E33.086; 438/116; 438/26
(58) Field of Classification Search
USPC .............. 257/99, 735, E33.066; 438/26, 116
See application file for complete search history.

(56) References Cited

U.S. PATENT DOCUMENTS

| 6,872,585 | B2 | 3/2005 | Matsumura et al. |
| 6,953,952 | B2 | 10/2005 | Asakawa |
| 2006/0180824 | A1 | 8/2006 | Kim et al. |
| 2006/0289812 | A1* | 12/2006 | Wu et al. ............... 250/551 |
| 2007/0183159 | A1 | 8/2007 | Maeta et al. |
| 2007/0187709 | A1* | 8/2007 | Yamamoto .............. 257/99 |
| 2008/0151557 | A1 | 6/2008 | Su et al. |

FOREIGN PATENT DOCUMENTS

| JP | 2004-207688 A | 7/2004 |
| JP | 2005-317820 A | 11/2005 |
| JP | 2006-93470 A | 4/2006 |
| JP | 2007-5748 A | 1/2007 |
| JP | 3130684 U | 3/2007 |
| KR | 10-2006-0091980 A | 8/2006 |
| WO | WO 2006/003908 A1 | 1/2006 |

OTHER PUBLICATIONS

English Language Translation of JP 2005-317820.

* cited by examiner

*Primary Examiner* — Zandra Smith
*Assistant Examiner* — Jamie C Niesz
(74) *Attorney, Agent, or Firm* — Birch, Stewart, Kolasch & Birch, LLP (57) ABSTRACT

Provided is a light emitting device package. The light emitting device package comprises a housing, first and second lead frames, and a light emitting device. The housing comprises a front opening and side openings. The first and second lead frames pass through the housing to extend to an outside. A portion of each lead frame being exposed through the front opening. The light emitting device is in the front opening and electrically connected to the first and second lead frames. A protrusion protruding in a direction of the side opening is formed on an inner surface of the side opening.

15 Claims, 9 Drawing Sheets

LIGHT EMITTING DEVICE PACKAGE AND MANUFACTURING METHOD THEREOF

TECHNICAL FIELD

The present disclosure relates to a light emitting device package, and a manufacturing method thereof.

BACKGROUND ART

Recently, a light emitting diode (LED) is widely used as a light emitting device. The LED is formed by stacking an N-type semiconductor layer, an active layer, and a P-type semiconductor layer. Light is generated by combination of electrons and holes in the active layer by supplying power to the N-type semiconductor layer and the P-type semiconductor layer.

The light emitting device package includes a light emitting device, a lead frame providing power to the light emitting device, and a housing supporting the light emitting device and the lead frame.

DISCLOSURE OF INVENTION

Technical Problem

Embodiments provide a light emitting device package comprising a light emitting device, a lead frame, and a housing, and a manufacturing method thereof.

Embodiments also provide a light emitting device package that allows a lead frame to be properly formed during a manufacturing process, and a manufacturing method thereof.

Embodiments also provide a light emitting device package that can prevent damage of a housing during a manufacturing process, and a manufacturing method thereof.

Technical Solution

In an embodiment, a light emitting device package comprises: a housing comprising a front opening and side openings; first and second lead frames passing through the housing to extend to an outside, a portion of each lead frame being exposed through the front opening; and a light emitting device in the front opening and electrically connected to the first and second lead frames, a protrusion protruding in a direction of the side opening being formed on an inner surface of the side opening.

In an embodiment, a light emitting device package comprises: a housing comprising a front opening and side openings; first and second lead frames passing through the housing to extend to an outside, a portion of each lead frame being exposed through the front opening and the side openings; and a light emitting device in the front opening and electrically connected to the first and second lead frames.

In an embodiment, a method for manufacturing a light emitting device package comprises: preparing a metal plate; performing a punching process on the metal plate to form first and second lead frame members and first and second support members; forming a housing by injection, the housing comprising portions of the first and second lead frame members and the first and second support members therein, and comprising a front opening exposing portions of the first and second lead frame members to a front side; separating the first and second lead frame members from the metal plate and bending the first and second lead frames; and separating the first and second support members from the housing, thereby separating the housing from the metal plate.

The details of one or more embodiments are set forth in the accompanying drawings and the description below. Other features will be apparent from the description and drawings, and from the claims.

Advantageous Effects

A light emitting device package and a manufacturing method thereof according to embodiments allow a lead frame to be properly formed during a manufacturing process and can prevent damage of a housing.

MODE FOR THE INVENTION

Reference will now be made in detail to the embodiments of the present disclosure, examples of which are illustrated in the accompanying drawings.

Figure 1:
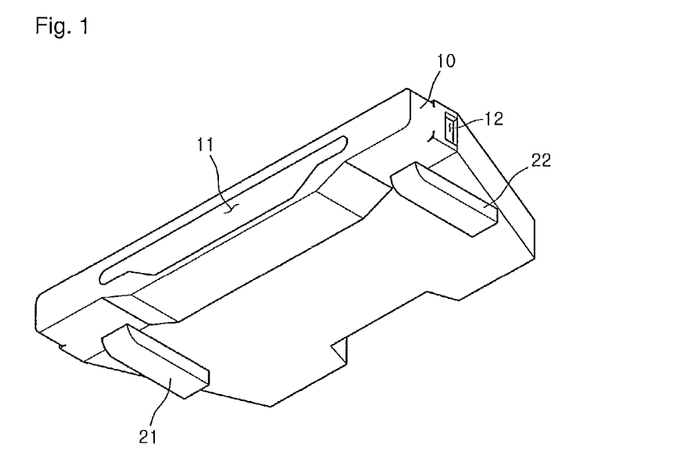
FIG. 1 is a perspective view of a light emitting device package according to an embodiment as viewed from the lower direction.
Figure 2:
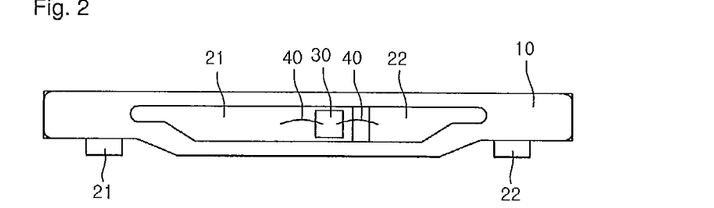
FIG. 2 is a view of a light emitting device package according to an embodiment as viewed from the front side.

FIG. 1 is a perspective view of a light emitting device package according to an embodiment as viewed from the lower direction, and FIG. 2 is a view of a light emitting device package according to an embodiment as viewed from the front side.

Referring to FIGS. 1 and 2, the light emitting device package according to the embodiment includes: a housing 10 including a front opening 11 and side openings 12; first and second lead frames 21 and 22 that pass through the housing 10, that are partially exposed through the front opening 11, and that are partially disposed under the housing 10; a light emitting device 30 installed to the first lead frame 21 and electrically connected to the first and second lead frames 21 and 22 through wires 40.

More specifically, the housing 10 is formed of an injectable resin material and can be formed of plastics such as polyphthalamide (PPA). The housing 10 is formed by performing molding with the first and second lead frames 21 and 22 inserted.

The first and second lead frames 21 and 22 are formed of metal such as copper. The surfaces of the first and second lead frames 21 and 22 are plated with metal having high reflectivity such as Ag and Al to improve light reflectivity. The first and second lead frames 21 and 22 are supported by the housing 10.

Portions of the first and second lead frames 21 and 22 protrude below the housing 10. The first and second lead frames 21 and 22 protruding below the housing 10 are electrically connected with an external power source. For example, the first and second lead frames 21 and 22 protruding below the housing 10 can be attached on a printed circuit board (PCB) and electrically connected to the PCB.

Therefore, the first and second lead frames 21 and 22 protruding below the housing 10 are bent to be parallel to the lower surface of the housing 10 so that they are easily attached on the PCB.

A light emitting device 30 is installed on the first lead frame 21. The light emitting device 30 can be an LED, and electrically connected with the first and second lead frames 21 and 22. For example, the electrical connection between the light emitting device 30 and the first and second lead frames 21 and 22 can be performed through wires 40.

The front opening formed in the housing 10 can be filled with a molding member such as a resin. The molding member can include phosphors for changing the wavelength of light emitted from the light emitting device 30.

Meanwhile, the side openings 12 formed in the lateral sides of the housing 10 are space where first and second support members supporting the housing 10 at both sides during a forming process that allows the first and second lead frames 21 and 22 to be bent have been located.

The side openings 12 are described in more detail below.

Figure 3:
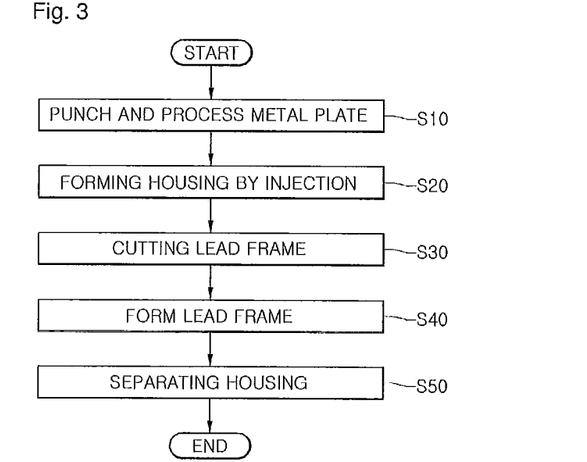
FIG. 3 is a flowchart explaining a manufacturing process of a light emitting device package according to an embodiment.

FIG. 3 is a flowchart explaining a manufacturing process of a light emitting device package according to an embodiment.

Referring to FIG. 3, the manufacturing process of the light emitting device package includes a metal plate punching process operation (S10), a housing injection operation (S20), a lead frame cutting operation (S30), a lead frame forming operation (S40), and a housing separation operation (S50).

Though the manufacturing process of the light emitting device package according to the embodiment can manufacture several to several tens of light emitting device packages simultaneously using one metal plate, a manufacturing process of only one light emitting device package is described for convenience in description.

The manufacturing process of the light emitting device package illustrated in FIG. 3 is described in more detail with reference to FIGS. 4 to 10.

FIGS. 4 to 10 are views explaining a light emitting device package and a manufacturing method thereof according to a first embodiment.

Referring to FIGS. 3 to 10, a metal plate 50 is prepared. The metal plate 50 can be formed of copper, for example. The outer surface of the metal plate 50 can be coated with Ag or Al having high reflectivity.

Figure 4:
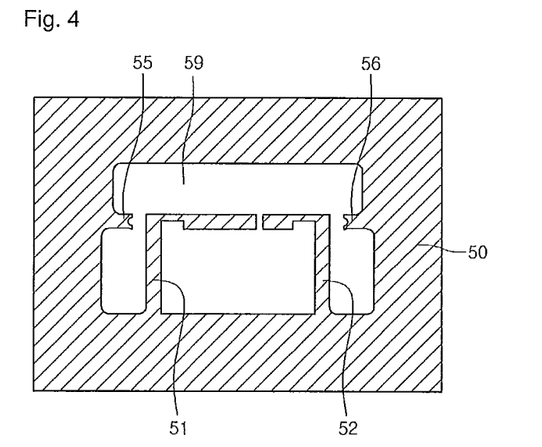
FIGS. 4 to 10 are views explaining a light emitting device package and a manufacturing method thereof according to a first embodiment.

The metal plate 50 is selectively removed to have a predetermined pattern by a punching process, so that an opening 59 is formed. Also, portions not removed by the punching process are formed as first and second lead frame members 51 and 52, and first and second support members 55 and 56.

Figure 5:
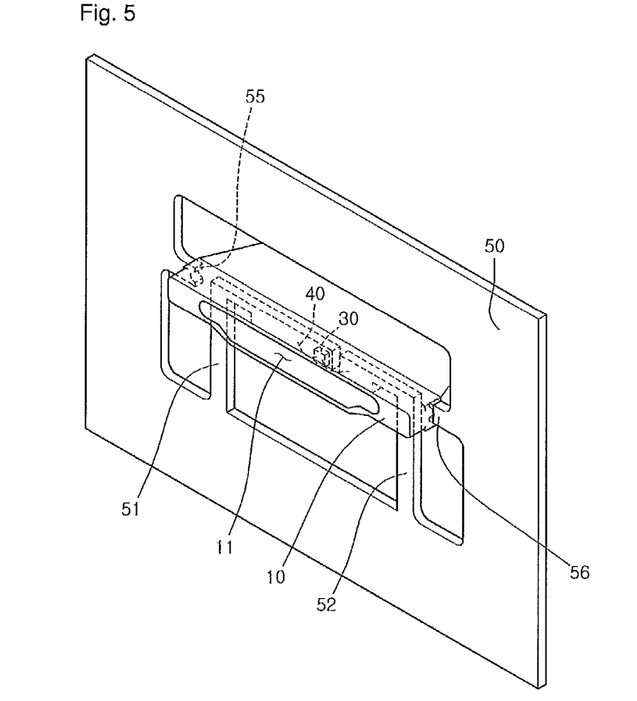

Referring to FIG. 5, the housing 10 is formed by injection such that the first and second lead frame members 51 and 52, and the first and second support members 55 and 56 are formed inside the housing 10.

That is, the housing 10 is formed by insertion-molding the first and second lead frame members 51 and 52, and the first and second support members 55 and 56.

At this point, a front opening 11 is formed in the front side of the housing 10. The first and second lead frame members 51 and 52 are exposed to the front through the front opening 11. Simultaneously, with portions of the first and second support members 55 and 56 inserted into both sides of the housing 10, the injection of the housing 10 is performed.

Subsequently, a process of installing the light emitting device 30 on the first lead frame member 51, and electrically connecting the light emitting device 30 with the first and second lead frame members 51 and 52 through wires 40 can be performed. Also, a process of injecting a molding member including phosphor into the front opening 11 can be performed.

Of course, the process of installing the light emitting device 30, the process of connecting the wires 40, and the process of injecting the molding member can be performed during a subsequent process.

Figure 6:
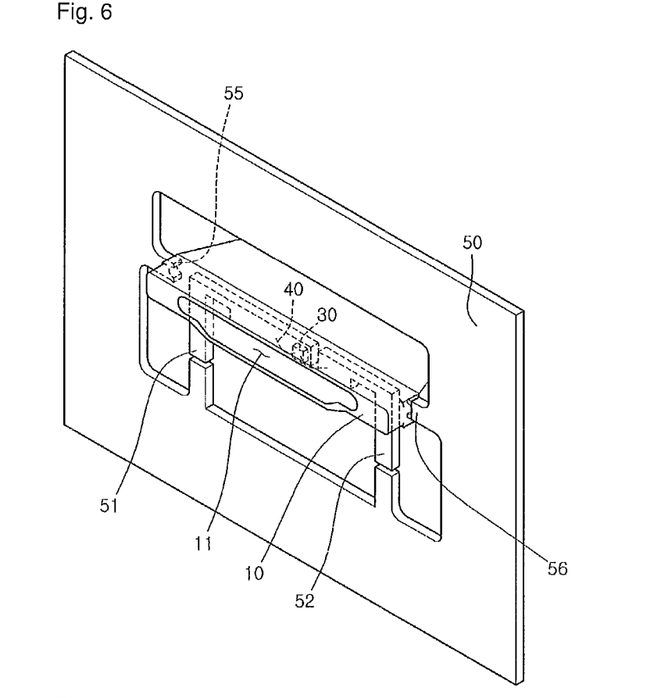

Referring to FIG. 6, the first and second lead frame members 51 and 52 are separated from the metal plate 50 by cutting the first and second lead frame members 51 and 52.

Figure 7:
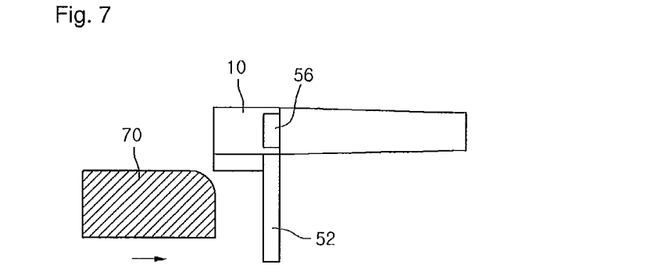
Figure 8:
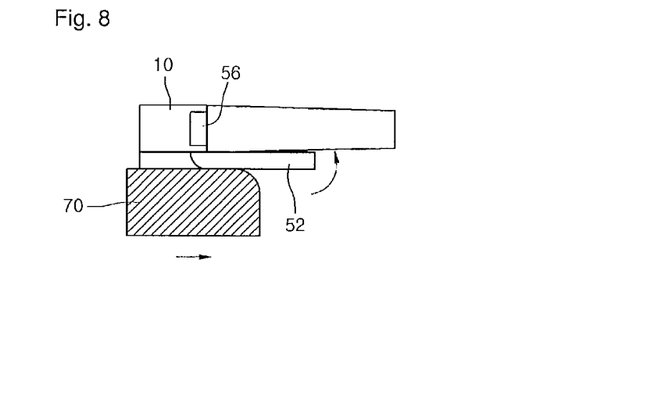

Referring to FIGS. 7 and 8, the first and second lead frame members 51 and 52 protruding below the housing 10 are vertically bent by applying force on the first and second lead frame members 51 and 52 separated from the metal plate 50 using a forming mold 70.

At this point, the first and second support frames 55 and 56 support the housing 10 on its both sides to prevent the housing 10 from moving when the force is applied to the first and second lead frame members 51 and 52.

Figure 9:
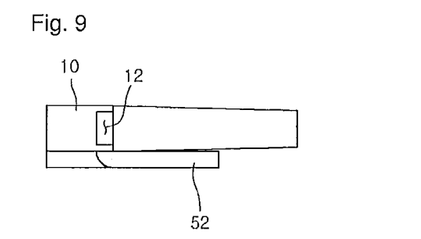

Referring to FIG. 9, after the forming of the first and second lead frame members 51 and 52 is completed, the first and second support members 55 and 56 are separated from the housing 10.

The first and second support members 55 and 56 can be separated from the lateral sides of the housing 10 by applying force on the connection portions with the metal plate 50.

Figure 10:
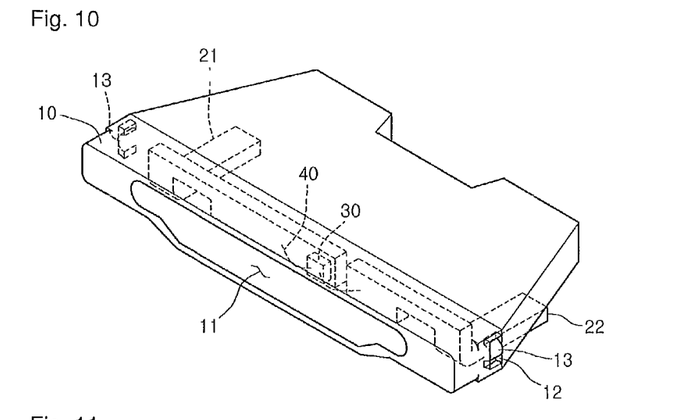

Referring to FIG. 10, as the first and second support members 55 and 56 are separated from the lateral sides of the housing 10, the side openings 12 are formed in the portions in which the first and second support members 55 and 56 have been fixed. The widths of the side openings 12 are the same as the thicknesses of the first and second support members 55 and 56. Similarly, the widths of the side openings 12 are the same as the thicknesses of the first and second lead frames 21 and 22.

Also, the side opening 12 is located on the same plane as those of the first and second lead frames 21 and 22.

Meanwhile, referring to FIGS. 4 and 5, the ends of the first and second support members 55 and 56 are formed in concave shapes with respect to the direction in which the light emitting device 30 is installed. The structures of the first and second support members 55 and 56 are intended for solidly supporting the housing 10 during the process of forming the first and second lead frame members 51 and 52, and simultaneously, minimizing the damage of the housing 10 during the process of separating the first and second support members 55 and 56 from the housing 10.

Therefore, referring to FIG. 10, in the case where the first and second support members 55 and 56 are separated from the housing 10, a protrusion 13 whose central portion protrudes convexly in the opening direction of the side opening 12 is formed in the side opening 12 of the housing 10 corresponding to the structure of each of the first and second support members 55 and 56.

Since the protrusion 13 is simultaneously formed while the housing 10 is formed, the protrusion 13 and the housing 10 are formed of the same material.

FIGS. 11 to 15 are views explaining a light emitting device package and a manufacturing method thereof according to a second embodiment.

In describing the second embodiment, explanations of the same parts as those of the first embodiment are omitted.

Figure 11:
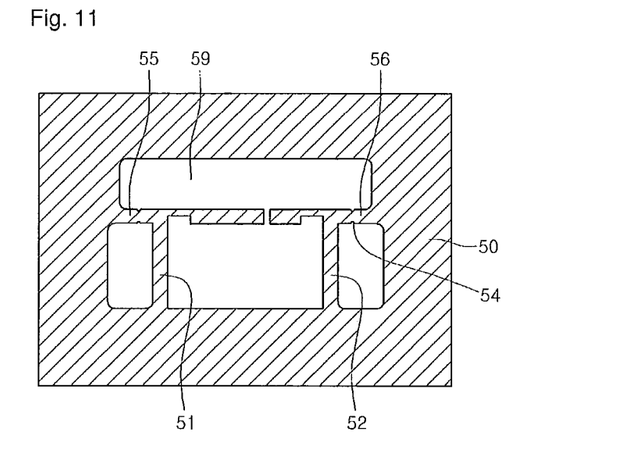
FIGS. 11 to 15 are views explaining a light emitting device package and a manufacturing method thereof according to a second embodiment.

Referring to FIG. 11, a metal plate 50 is prepared. The metal plate 50 can be formed of copper, for example. The outer surface of the metal plate 50 can be coated with Ag or Al having high reflectivity.

The metal plate 50 is selectively removed to have a predetermined pattern by a punching process, so that an opening 59 is formed. Also, portions not removed by the punching process are formed as first and second lead frame members 51 and 52, and first and second support members 55 and 56.

Unlike the first embodiment, according to the second embodiment, the first and second lead frame members 51 and 52 are connected with the first and second support members 55 and 56, and a notch 54 is formed so that the width of the connection portion narrows.

Figure 12:
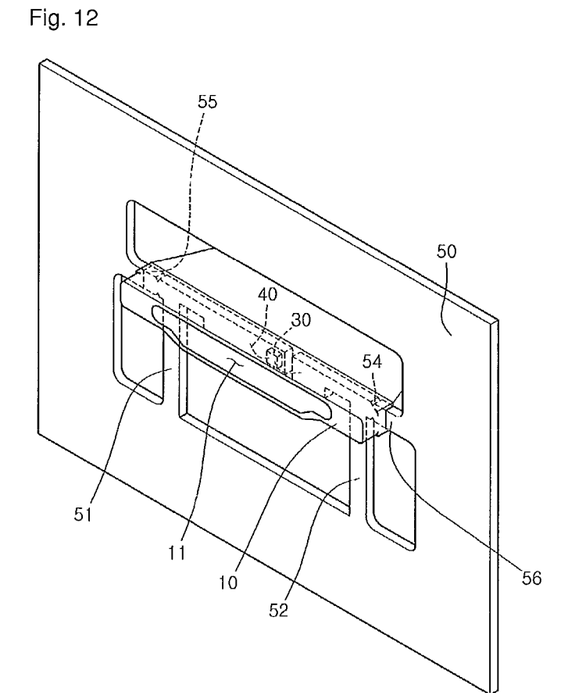

Referring to FIG. 12, the housing 10 is formed by injection such that the first and second lead frame members 51 and 52, and the first and second support members 55 and 56 are disposed inside the housing 10.

That is, the housing 10 is formed by insertion-molding the first and second lead frame members 51 and 52, and the first and second support members 55 and 56.

At this point, a front opening 11 is formed in the front side of the housing 10. The first and second lead frame members 51 and 52 are exposed to the front through the front opening 11. Simultaneously, with the first and second support members 55 and 56 inserted into both sides of the housing 10, the injection of the housing 10 is performed.

Subsequently, a process of installing the light emitting device 30 on the first lead frame member 51, and electrically connecting the light emitting device 30 with the first and second lead frame members 51 and 52 through wires 40 can be performed. Also, a process of injecting a molding member including phosphor into the front opening 11 can be performed.

Of course, the process of installing the light emitting device 30, the process of connecting the wires 40, and the process of injecting the molding member can be performed during a subsequent process.

After that, as described in the first embodiment, the forming process of cutting and bending the first and second lead frame members 51 and 52 is performed.

Also, after the forming of the first and second lead frame members 51 and 52 is completed, the first and second support members 55 and 56 are separated from the housing 10.

The first and second support members 55 and 56 can be separated from the lateral sides of the housing 10 by applying force on the connection portions with the metal plate 50.

At this point, while portion where the notch 54 is formed is cut, the housing 10 can be separated from the metal plate 50.

Figure 13:
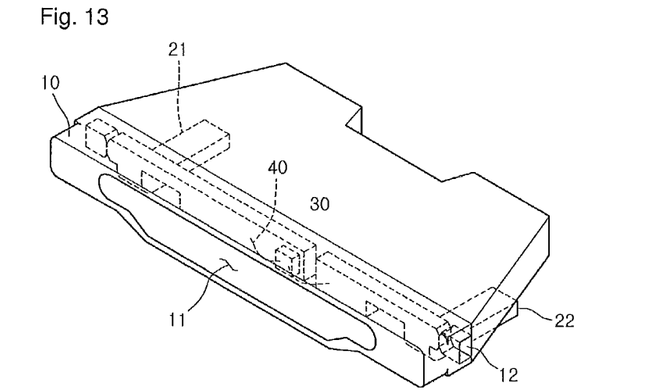

Referring to FIG. 13, since the first and second support members 55 and 56 are separated from the lateral sides of the housing 10, side openings 12 are formed in the portions where the first and second support members 55 and 56 have been fixed.

Meanwhile, since the first and second support members 55 and 56, and the first and second lead frame members 51 and 52 are connected to each other, respectively, they can solidly support the housing 10 during a process of forming the first and second lead frame members 51 and 52. Also, since notches 54 are formed in connection portions between the first and second support members 55 and 56, and the first and second lead frame members 51 and 52, the damage of the lateral side of the housing 10 can be minimized during a process of separating the first and second support members 55 and 56 from the housing 10.

Therefore, referring to FIG. 13, in the case where the first and second support members 55 and 56 are separated from the housing 10, the side openings 12 of the housing 10 corresponding to the structures of the first and second support members 55 and 56 have an inner area smaller than an outer area. This is because an injection material forming the housing is also formed on the portion where the notch 54 is formed.

Also, the area of the side opening 12 is greater than the area of each of the first and second lead frames 51 and 52 exposed through the side opening 12.

Also, in the case where the first and second support members 55 and 56 are separated from the housing 10, since the connection portions between the first and second support members 55 and 56 and the first and second lead frame members 51 and 52 are cut, the cut surfaces of the first and second lead frames 21 and 22, that is, the separation surfaces from the first and second support members 55 and 56 can be exposed at the inner ends of the side openings 12.

The cut surfaces of the first and second lead frames 21 and 22 can be shown without metal having high reflectivity such as Ag and Al being coated.

Figure 14:
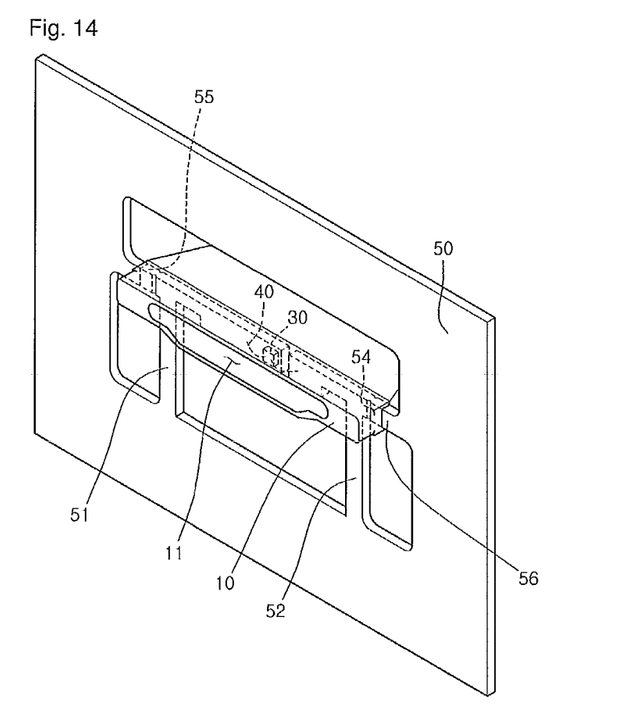
Figure 15:
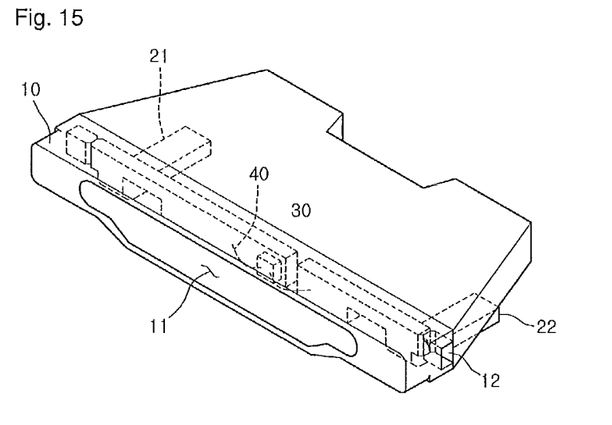

FIGS. 14 and 15 are views illustrating another example of a light emitting device package and a manufacturing method thereof according to the second embodiment.

Though the notch 54 is formed along the thickness direction of the metal plate 50 in FIGS. 11 to 13, the notch 54 is formed along plate surface direction of the metal plate 50 in FIGS. 14 and 15.

Though not shown, the notch 54 can be formed along the thickness direction and the plate surface direction of the metal plate 50.

FIGS. 16 to 20 are views explaining a light emitting device package and a manufacturing method thereof according to a third embodiment.

In describing the third embodiment, explanations of the same parts as those of the first embodiment are omitted.

Figure 16:
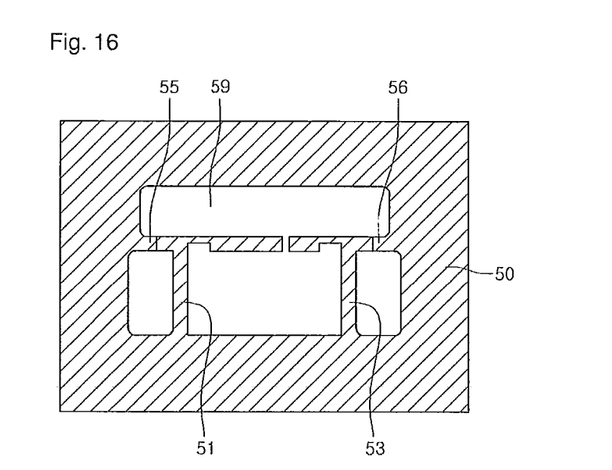
FIGS. 16 to 20 are views explaining a light emitting device package and a manufacturing method thereof according to a third embodiment.

Referring to FIG. 16, a metal plate 50 is prepared. The metal plate 50 can be formed of copper, for example. The outer surface of the metal plate 50 can be coated with Ag or Al having high reflectivity.

The metal plate 50 is selectively removed to have a predetermined pattern by a punching process, so that an opening 59 is formed. Also, portions not removed by the punching process are formed as first and second lead frame members 51 and 52, and first and second support members 55 and 56.

Unlike the first embodiment, according to the third embodiment, the first and second lead frame members 51 and 52 are connected with the first and second support members 55 and 56, and the first and second lead frame members 51 and 52 are partially connected with the first and second support members 55 and 56.

Figure 17:
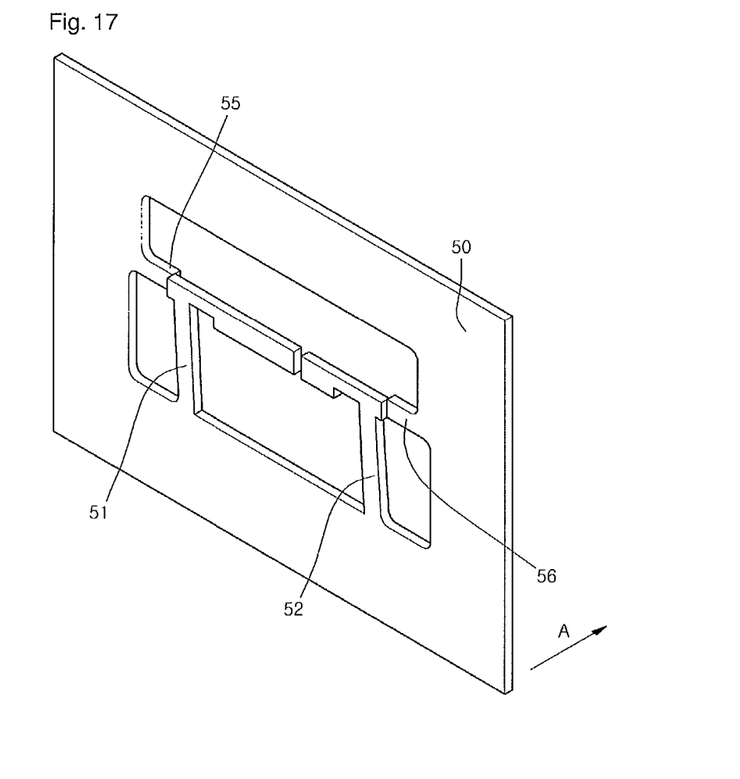
Figure 18:
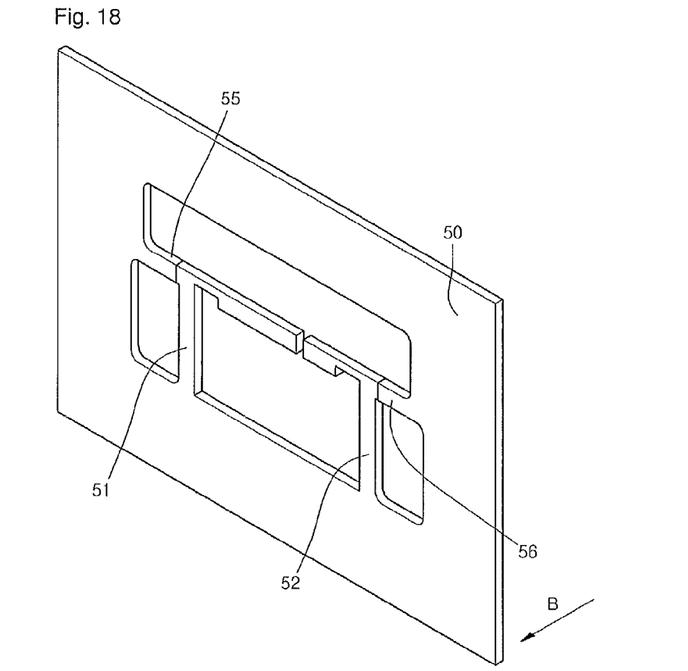

Referring to FIGS. 17 and 18, an opening 59 is formed by performing a punching process on the metal plate 50, and then force is applied on the connection portions of the first and second lead frame members 51 and 52 and the first and second support members 55 and 56 in directions A and B using an equipment such as a press, so that the first and second lead frame members 51 and 52 are partially connected with the first and second support members 55 and 56. Since the metal plate 50 has softness, the first and second lead frame members 51 and 52 are not completely separated from but partially connected with the first and second support members 55 and 56.

Figure 19:
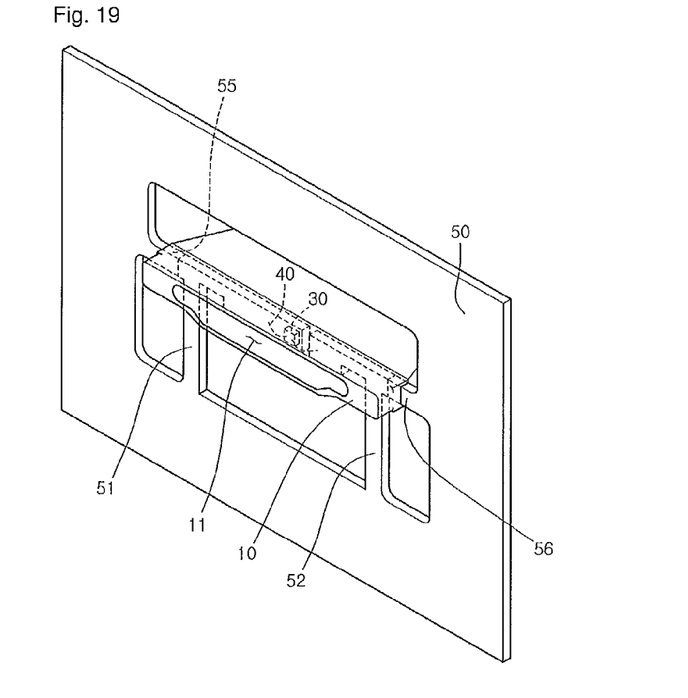

Referring to FIG. 19, the housing 10 is formed by injection such that the first and second lead frame members 51 and 52, and the first and second support members 55 and 56 are disposed inside the housing 10.

That is, the housing 10 is formed by insertion-molding the first and second lead frame members 51 and 52, and the first and second support members 55 and 56.

At this point, a front opening 11 is formed in the front side of the housing 10. The first and second lead frame members 51 and 52 are exposed to the front through the front opening 11. Simultaneously, with the first and second support members 55 and 56 inserted into both sides of the housing 10, the injection of the housing 10 is performed.

Subsequently, a process of installing a light emitting device 30 on the first lead frame member 51, and electrically connecting the light emitting device 30 with the first and second lead frame members 51 and 52 through wires can be performed. Also, a process of injecting a molding member including phosphor into the front opening 11 can be performed.

Of course, the process of installing the light emitting device 30, the process of connecting the wires 40, and the process of injecting the molding member can be performed during a subsequent process.

After that, as described in the first embodiment, the forming process of cutting and bending the first and second lead frame members 51 and 52 is performed.

Also, after the forming of the first and second lead frame members 51 and 52 is completed, the first and second support members 55 and 56 are separated from the housing 10.

The first and second support members 55 and 56 can be separated from the lateral sides of the housing 10 by applying force on the connection portions with the metal plate 50.

At this point, while the connection portions between the first and second lead frame members 51 and 52 and the first and second support members 55 and 56 is cut, the housing 10 can be separated from the metal plate 50.

Figure 20:
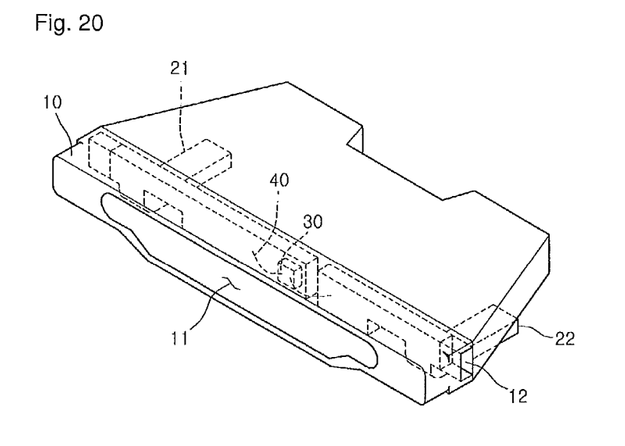

Referring to FIG. 20, since the first and second support members 55 and 56 are separated from the lateral sides of the housing 10, side openings 12 are formed in the portions where the first and second support members 55 and 56 have been fixed.

Meanwhile, since the first and second support members 55 and 56, and the first and second lead frame members 51 and 52 are partially connected to each other, respectively, they can solidly support the housing 10 during a process of forming the first and second lead frame members 51 and 52. Also, since the first and second support members 55 and 56, and the first and second lead frame members 51 and 52 are partially connected to each other only, respectively, the damage of the lateral side of the housing 10 can be minimized during a process of separating the first and second support members 55 and 56 from the housing 10.

Therefore, referring to FIG. 20, in the case where the first and second support members 55 and 56 are separated from the housing 10, the ends of the first and second lead frames 21 and 22 are partially exposed through the side openings 12 of the housing 10.

Also, in the case where the first and second support members 55 and 56 are separated from the housing 10, since the connection portions between the first and second support members 55 and 56 and the first and second lead frame members 51 and 52 are cut, the cut surfaces of the first and second lead frames 21 and 22, that is, the separation surfaces from the first and second support members 55 and 56 can be exposed at the inner ends of the side openings 12.

The cut surfaces of the first and second lead frames 21 and 22 can be shown without metal having high reflectivity such as Ag and Al being coated.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The light emitting device package according to the embodiments can be used as a light source of an electronic apparatus and a lighting apparatus.

The invention claimed is:

1. A semiconductor light emitting device package comprising:
   a housing comprising a front opening and side openings, wherein each side openings has a top edge and bottom edge formed by a side portion of the housing, each side opening formed as a recess surrounded by a side portion of the housing, including the top edge and the bottom edge;
   first and second lead frames passing through a bottom surface of the housing to extend to an outside, a portion of each lead frame being exposed through the front opening; and
   a semiconductor light emitting device in the front opening and electrically connected to the first and second lead frames, a protrusion protruding in a direction of a corresponding side opening being formed on an inner surface of the corresponding side opening and disposed in the recess,
   wherein the protrusion is spaced from the top edge and the bottom edge.

2. The semiconductor light emitting device package according to claim 1, wherein the protrusion has a central portion of a convex shape.

3. The semiconductor light emitting device package according to claim 1, wherein the protrusion is formed of the same material as that of the housing.

4. The semiconductor light emitting device package according to claim 1, wherein thicknesses of the first and second lead frames are the same as widths of the side openings.

5. The semiconductor light emitting device package according to claim 1, wherein the first and second lead frames pass through the bottom surface of the housing and each end portion of the first and second lead frames is bent parallel to the bottom surface of the housing.

6. The semiconductor light emitting device package according to claim 1, wherein the light emitting device is on the first lead frame, and electrically connected to the first and second lead frames through wires.

7. The semiconductor light emitting device package according to claim 1, wherein the first and second lead frames and the side openings are located on the same plane.

8. A semiconductor light emitting device package comprising:
   a housing comprising a front opening and side openings, wherein edges of each opening form a closed geometric shape, each side opening formed as a recess surrounded by a side portion of the housing;
   first and second lead frames passing through a bottom surface of the housing to extend to an outside, a portion of each lead frame being exposed through the front opening and the side openings; and a semiconductor light emitting device in the front opening and electrically connected to the first and second lead frames, wherein end portions of each lead frame are disposed under the bottom surface of the housing, and wherein the side openings have an inner area smaller than an outer area.

9. The semiconductor light emitting device package according to claim 8, wherein the first and second lead frames exposed through the side openings have a cut surface having no plated layer and exposed to a lateral side.

10. The semiconductor light emitting device package according to claim 8, wherein thicknesses of the first and second lead frames are the same as widths of the side openings.

11. The semiconductor light emitting device package according to claim 8, wherein the first and second lead frames are extended passing through the bottom surface of the housing and each end portion of the first and second lead frames is bent parallel to the bottom surface of the housing.

12. The semiconductor light emitting device package according to claim 8, wherein the semiconductor light emitting device is on the first lead frame, and electrically connected to the first and second lead frames through wires.

13. The semiconductor light emitting device package according to claim 8, wherein at least portions of the first and second lead frames and the side openings are located on the same plane.

14. The semiconductor light emitting device package according to claim 8, wherein areas of the side openings are greater than areas of the first and second lead frame members exposed through the side openings.

15. A semiconductor light emitting device package comprising:

a housing comprising a front opening and side openings, wherein each side openings has a top edge and bottom edge spaced from a top edge and a bottom edge of a side portion of the housing, each side opening formed as a recess surrounded by a side portion of the housing, including the top edge and the bottom edge;

first and second lead frames passing through a bottom surface of the housing to extend to an outside, a portion of each lead frame being exposed through the front opening; and a semiconductor light emitting device in the front opening and electrically connected to the first and second lead frames, a protrusion protruding in a direction of a corresponding side opening being formed on an inner surface of the corresponding side opening and disposed in the recess, wherein the protrusion is spaced from the side portion of the housing forming the recess.

* * * * *